(12) United States Patent
Rachmady et al.

(10) Patent No.: US 7,851,790 B2
(45) Date of Patent: Dec. 14, 2010

(54) ISOLATED GERMANIUM NANOWIRE ON SILICON FIN

(75) Inventors: Willy Rachmady, Beaverton, OR (US);
Been-Yih Jin, Lake Oswego, OR (US);
Ravi Pillarisetty, Portland, OR (US);
Robert Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 72 days.

(21) Appl. No.: 12/317,887

(22) Filed: Dec. 30, 2008

(65) Prior Publication Data

US 2010/0164102 A1 Jul. 1, 2010

(51) Int. Cl.
H01L 29/08 (2006.01)

(52) U.S. Cl. .................. 257/41; 438/197; 438/149; 438/151; 438/176; 438/198; 438/211; 438/257; 438/588; 438/283; 438/142; 438/195; 438/213; 438/229; 257/66; 257/72; 257/E21.179; 257/347; 257/331; 257/250; 257/E27.112; 257/E29.264; 257/E29.275

(58) Field of Classification Search .................. 438/197, 438/149, 151, 176, 198, 257, 211, 588, 283, 438/142, 195, 213, 229; 257/66, 72, 41, 257/E21.179, 347, 331, 250, E27.112, E29.264, 257/E29.275
See application file for complete search history.

(56) References Cited

U.S. PATENT DOCUMENTS

| | | | | |
|---|---|---|---|---|
| 4,692,996 A * | 9/1987 | Minato | ...................... | 438/355 |
| 6,335,260 B1 * | 1/2002 | Tseng et al. | ................. | 438/430 |
| 7,309,629 B2 * | 12/2007 | Takahashi | .................. | 438/199 |
| 7,485,557 B2 * | 2/2009 | Han et al. | .................... | 438/589 |
| 7,588,977 B2 * | 9/2009 | Suk et al. | ..................... | 438/197 |
| 2005/0227435 A1 * | 10/2005 | Oh et al. | ..................... | 438/257 |
| 2005/0248003 A1 * | 11/2005 | Tsybeskov et al. | ......... | 257/623 |
| 2006/0086977 A1 * | 4/2006 | Shah et al. | .................. | 257/347 |
| 2006/0292772 A1 * | 12/2006 | Anderson et al. | .......... | 438/197 |
| 2008/0001171 A1 * | 1/2008 | Tezuka et al. | ............... | 257/191 |
| 2008/0064149 A1 * | 3/2008 | Cohen | ........................ | 438/157 |
| 2008/0085602 A1 * | 4/2008 | Seong et al. | ................ | 438/693 |
| 2008/0227273 A1 * | 9/2008 | Hisamatsu | .................. | 438/479 |
| 2008/0237575 A1 * | 10/2008 | Jin et al. | ....................... | 257/19 |
| 2009/0008705 A1 * | 1/2009 | Zhu et al. | .................... | 257/327 |
| 2009/0065850 A1 * | 3/2009 | Oh et al. | ..................... | 257/324 |
| 2009/0085027 A1 * | 4/2009 | Jin et al. | ....................... | 257/24 |
| 2009/0170251 A1 * | 7/2009 | Jin et al. | ..................... | 438/197 |

* cited by examiner

Primary Examiner—Fernando L Toledo
Assistant Examiner—Ankush k Singal
(74) Attorney, Agent, or Firm—Winkle, PLLC

(57) ABSTRACT

The present invention describes a method of and an apparatus for providing a wafer, the wafer including Silicon; etching trenches in the wafer to form Silicon fins; filling Silicon Oxide in the trenches; planarizing the Silicon Oxide; recessing the Silicon Oxide to a first thickness to form exposed Silicon pedestals from the Silicon fins; depositing SiGe over the exposed Silicon pedestal; recessing the Silicon Oxide to a second thickness; undercutting the exposed Silicon pedestals to form necked-in Silicon pedestals; oxidizing thermally and annealing the SiGe; and forming Germanium nanowires.

3 Claims, 3 Drawing Sheets

US 7,851,790 B2

ISOLATED GERMANIUM NANOWIRE ON SILICON FIN

BACKGROUND OF THE INVENTION

1. Field of the Invention

The present invention relates to a field of semiconductor integrated circuit manufacturing, and more specifically, to a method of forming isolated Germanium nanowire on Silicon fin.

2. Discussion of Related Art

Gordon Moore originally observed in 1964 that technology innovation had led to a doubling of a density (number of transistors per unit area) of an integrated circuit (IC) chip approximately every 12 months. By 1975, the trend had stabilized to a doubling of the density about every 18 months. Over the ensuing decades, the semiconductor industry has adhered closely to a well-known Moore's Law in increasing the density of transistors for each generation of IC chips.

The IC chip includes a planar transistor that is formed in a substrate, such as a wafer. The wafer is made from a semiconductor material, such as silicon. During processing, a material may be added to, or removed from, the wafer. The material may include an insulator, such as silicon oxide, or a conductor, such as copper.

Additive processes that are used to form material, partially or completely, on the wafer include chemical vapor deposition (HVFO, sputtering, electroplating, oxidation, and ion implantation.

Subtractive processes that are used to remove material, partially or completely, from the wafer include wet etching, dry etching, and chemical-mechanical polishing (CMP).

For many layers of material, photolithographic processes are used, in conjunction with the additive processes or the subtractive processes, to pattern portions of the wafer.

Maintaining an aggressive schedule required to comply with Moore's Law has resulted in a scaling down of a metal oxide semiconductor field effect transistor (MOSFET) that is used in a complementary metal-oxide-semiconductor (CMOS) circuit. The performance and reliability of the transistor have been improved by implementing many features such as semiconductor-on-insulator (SOI) substrate, selective epitaxially deposited (SED) raised source and drain, atomic layer deposited (ALD) high-k (dielectric constant) gate dielectric, metal gates, strained channel, and low-k interlevel dielectric (ILD) layers.

Future devices require a higher carrier mobility than available in Silicon. Germanium is a semiconductor material that may be formed into a nanowire and used as a channel that is modulated by a gate in a device.

DETAILED DESCRIPTION OF THE PRESENT INVENTION

Figure 1:
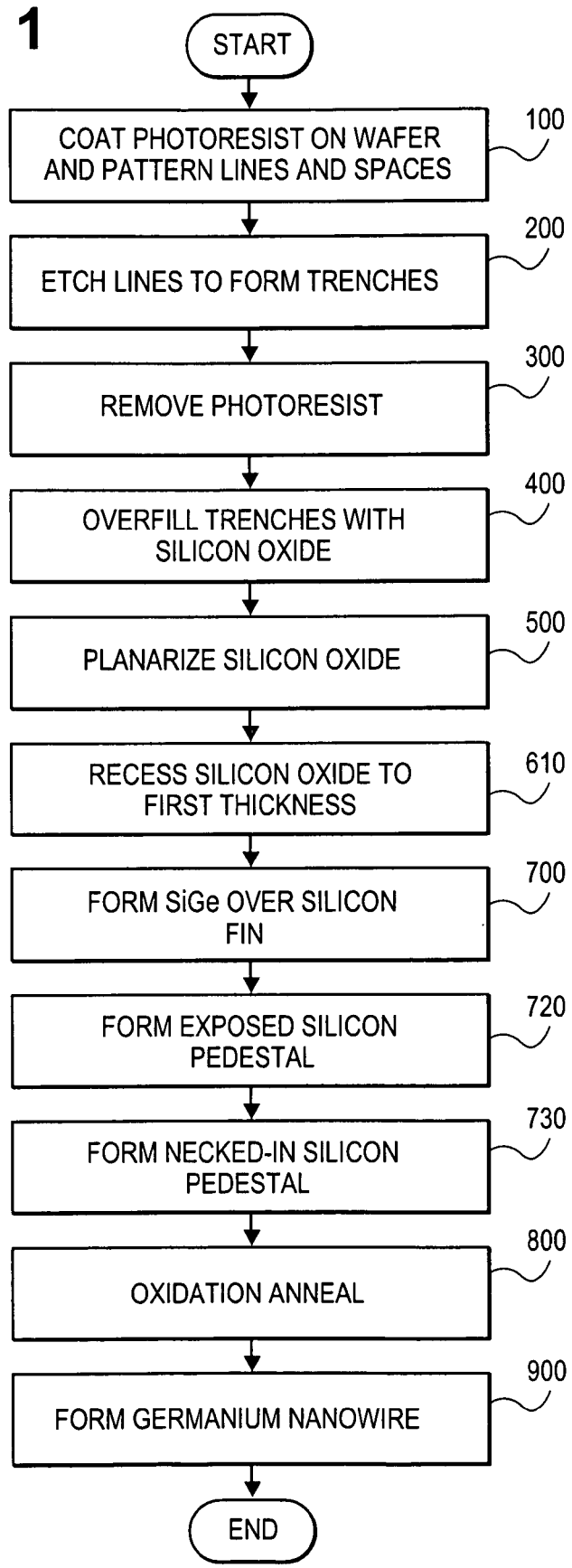
FIG. 1 is a flowchart of a method of forming a Germanium nanowire that is isolated by Silicon Oxide according to an embodiment of the present invention.

In the following description, numerous details, such as specific materials, dimensions, and processes, are set forth in order to provide a thorough understanding of the present invention. However, one skilled in the art will realize that the invention may be practiced without these particular details. In other instances, well-known semiconductor equipment and processes have not been described in particular detail so as to avoid obscuring the present invention.

In an embodiment of the present invention, a substrate includes a wafer that is formed from an elemental semiconductor, such as Silicon (Si) or Germanium (Ge). Germanium has a significantly higher electron mobility and hole mobility than Silicon.

In an embodiment of the present invention, the wafer is formed from a compound semiconductor, such as Silicon Germanium (SiGe).

In an embodiment of the present invention, the wafer is formed from a III-V compound semiconductor, such as Gallium Arsenide (GaAs).

In an embodiment of the present invention, the wafer has a diameter of 150 (+/−0.2) mm and a thickness of 675 (+/−15) microns (um). In an embodiment of the present invention, the wafer has a diameter of 200 (+/−0.2) mm and a thickness of 725 (+/−15) microns (um). In an embodiment of the present invention, the wafer has a diameter of 300 (+/−0.2) mm and a thickness of 775 (+/−25) um. In an embodiment of the present invention, the wafer has a diameter of 450 mm and a thickness selected from a range of 700-1,300 um. In an embodiment of the present invention, the wafer has a diameter of 450 mm and a thickness selected from a range of 825-925 um. In certain circumstances, the wafer is initially thicker than described above so as to accommodate strips, cleans, etches, and reworks.

In an embodiment of the present invention, the backside of the wafer is thinned by lapping and polishing. In an embodiment of the present invention, the wafer has a thickness of 75-125 um after thinning down the backside. In an embodiment of the present invention, the wafer has a thickness of 25-75 um after thinning down the backside. In an embodiment of the present invention, the wafer has a thickness of 10-25 um after thinning down the backside.

In an embodiment of the present invention, the wafer includes a silicon-on-insulator (SOI) substrate. The SOI substrate allows a transistor to operate at a higher switching speed or with a lower power consumption when compared to a bulk semiconductor substrate. In an embodiment of the present invention, the SOI substrate is formed by bonding a device wafer with a handle wafer, one of which is thinned from its backside.

In an embodiment of the present invention, the SOI substrate includes an ultra-thin body formed over a buried oxide (BOX) layer. In an embodiment of the present invention, the ultra-thin body includes an elemental semiconductor or a compound semiconductor.

In an embodiment of the present invention, the ultra-thin body has a thickness of 20-35 nm. In an embodiment of the present invention, the ultra-thin body has a thickness of 12-20 nm. In an embodiment of the present invention, the ultra-thin body has a thickness of 7-12 nm.

In an embodiment of the present invention, the BOX layer has a thickness of 45-65 nm. In an embodiment of the present invention, the BOX layer has a thickness of 30-45 nm. In an embodiment of the present invention, the BOX layer has a thickness of 20-30 nm.

Figure 2A:
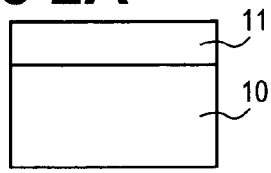
FIGS. 2A-J is an elevation view of a method of forming a Germanium nanowire that is isolated by Silicon Oxide according to an embodiment of the present invention.
Figure 2B:
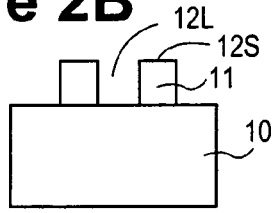

In an embodiment of the present invention as shown in block 100 of FIG. 1 and in FIG. 2A and FIG. 2B, a layer of photoresist 11 is coated or applied on a surface of the wafer 10. Then, an array of parallel lines 12L and spaces 12S is patterned in the photoresist using photolithography.

Figure 2C:
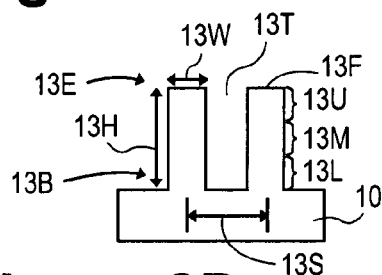

In an embodiment of the present invention as shown in block 200 of FIG. 1 and in FIG. 2C, a dry etch is used to etch the lines 12L in the photoresist 11 to form recesses or trenches 13T in the surface of the Silicon wafer 10. In an embodiment of the present invention, Sulfur Hexafluoride ($SF_6$) gas etches trenches 13 that are separated by high regions or mesas in the Silicon.

In an embodiment of the present invention, the mesas are narrow, thus defining vertical planes or fins 13F in the Silicon. The Silicon fins 13F include an upper portion 13U (near an end 13E of the fins), a middle portion 13M, and a lower portion 13L (near a base 13B of the fins).

In an embodiment of the present invention, the width 13W of the Silicon fins 13F is defined by a separation between the edges of adjacent trenches. In an embodiment of the present invention, the width 13W of the Silicon fins 13F is 2-7 nm. In an embodiment of the present invention, the width 13W of the Silicon fins 13F is 7-21 nm. In an embodiment of the present invention, the width 13W of the Silicon fins 13F is 21-53 nm.

In an embodiment of the present invention, the periodicity 13S of the Silicon fins 13F is defined by a distance between the centerline of adjacent trenches. In an embodiment of the present invention, the periodicity 13S of the Silicon fins 13F is 14-55 nm. In an embodiment of the present invention, the periodicity 13S of the Silicon fins 13F is 55-189 nm. In an embodiment of the present invention, the periodicity 13S of the Silicon fins 13F is 189-557 nm.

In an embodiment of the present invention, the length 13L (into the paper and not shown) of the Silicon fins 13F is defined by the length of the adjacent trenches 13T. In an embodiment of the present invention, the length 13L of the Silicon fins 13F is 7-10 um. In an embodiment of the present invention, the length 13L of the Silicon fins 13F is 10-15 um. In an embodiment of the present invention, the length 13L of the Silicon fins 13F is 15-22 um.

In an embodiment of the present invention, the height 13H of the Silicon fins 13F is defined by the depth of the adjacent trenches 13T. In an embodiment of the present invention, the height 13H of the Silicon fins 13F is 3-15 nm. In an embodiment of the present invention, the height 13H of the Silicon fins 13F is 15-60 nm. In an embodiment of the present invention, the height 13H of the Silicon fins 13F is 60-180 nm.

In an embodiment of the present invention as shown in block 300 of FIG. 1, the photoresist 12 is removed or stripped after the dry etch has formed the trenches 13T.

Figure 2D:
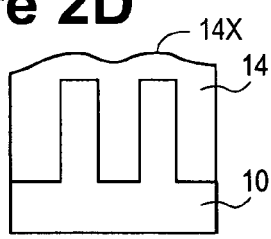

In an embodiment of the present invention as shown in block 400 of FIG. 1 and in FIG. 2D, a Silicon Oxide 14 is formed over the wafer 10 until the trenches 13T are overfilled with excess Silicon Oxide 14X.

Figure 2E:
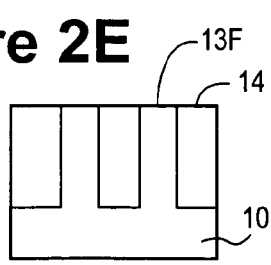

In an embodiment of the present invention as shown in block 500 of FIG. 1 and in FIG. 2E, a chemical mechanical planarization (CMP) is used to remove excess Silicon Oxide 14X so the Silicon Oxide 14 in the trenches 13T is flat and level with the Silicon fins 13F.

Figure 2F:
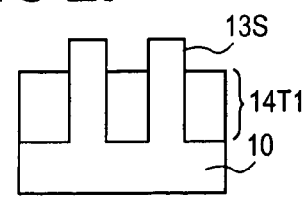

In an embodiment of the present invention as shown in block 610 of FIG. 1 and in FIG. 2F, a first etchant is used to recess (lower an upper surface of) the Silicon Oxide 14 in the trenches 13T to a first thickness 14T1. The first wet etchant also exposes vertical sidewalls 13S of an upper portion 13U of the Silicon fin 13. The first wet etchant selectively etches Silicon Oxide relative to Silicon and SiGe. In an embodiment of the present invention, the first etchant includes diluted Hydrofluoric Acid (DHF).

Figure 2G:
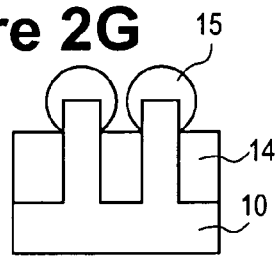

In an embodiment of the present invention as shown in block 700 of FIG. 1 and in FIG. 2G, an alloy of SiGe 15 is selectively formed as a shell or cladding over the exposed upper portion 13U (end) of the Silicon fin.

In an embodiment of the present invention, the SiGe 15 is formed with molecular beam epitaxy (MBE). In an embodiment of the present invention, the SiGe 15 is formed with atomic layer (chemical vapor) deposition (ALD). In an embodiment of the present invention, the SiGe 15 is formed with metal-organic chemical vapor deposition (MOCVD).

In an embodiment of the present invention, the $Si_{1-x}Ge_x$ 15 is formed over the exposed upper portion 13U of the Silicon fin, where $0.05<x<0.15$. In an embodiment of the present invention, the $Si_{1-x}Ge_x$ 15 is formed over the exposed upper portion 13U of the Silicon fin, where $0.15<x<0.25$. In an embodiment of the present invention, the $Si_{1-x}Ge_x$ 15 is formed over the exposed upper portion 13U of the Silicon fin, where $0.25<x<0.35$.

In an embodiment of the present invention, the SiGe 15 is intrinsic (undoped).

In an embodiment of the present invention, the SiGe 15 has a thickness of 10-40 nm. In an embodiment of the present invention, the SiGe 15 has a thickness of 40-120 nm. In an embodiment of the present invention, the SiGe 15 has a thickness of 120-240 nm.

The SiGe 15 grows epitaxially along certain axes (or directions) that depend upon the surface orientation of a crystal lattice at the upper portion 13U (towards the end 13E) of the Silicon fin 13F. In an embodiment of the present invention, the SiGe 15 resembles a tilted cube (not shown). In an embodiment of the present invention, the SiGe 15 has a roof-like structure (not shown). In embodiment of the present invention, the SiGe 15 has multiple 125-degree facets (not shown).

Figure 2H:
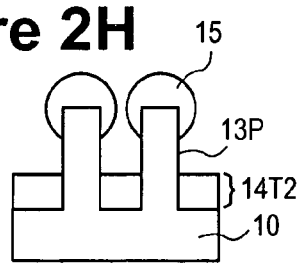

In an embodiment of the present invention as shown in block 720 of FIG. 1 and in FIG. 2H, a second etchant further recesses (lowers the upper surface of) the Silicon Oxide 14 in the trenches 13T to a second thickness 14T2. The second etchant uncovers a middle portion 13M of the Silicon fin 13F just below the upper portion 13U (now covered by SiGe 15) and creates an exposed Silicon pedestal 13P.

The second wet etchant selectively etches Silicon Oxide relative to both Silicon and SiGe. In an embodiment of the present invention, the second etchant is the same as the first etchant.

Figure 2I:
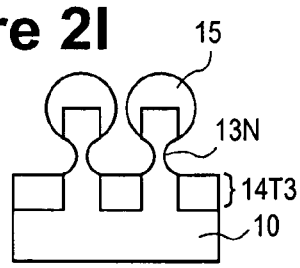

In an embodiment of the present invention as shown in block 730 of FIG. 1 and in FIG. 2I, a third etchant undercuts the exposed Silicon pedestal 13N without etching the overlying SiGe 15 or the adjacent Silicon Oxide 14. Thus, the exposed Silicon pedestal 13P in the middle portion 13M of the Silicon fin 13F is made thinner or narrower in its width 13W to form the necked-in Silicon pedestal 13N.

In an embodiment of the present invention, the third etchant is an isotropic etchant of the Silicon fin.

In an embodiment of the present invention, the third etchant is a preferential etchant along certain crystal orientations of the Silicon fin. In an embodiment of the present invention, the shape and contour of the necked-in Silicon pedestal 13N may be adjusted by rotating the crystal orientation at a surface of the substrate, such as by cutting the wafer 10 in a certain orientation. In an embodiment of the present invention, the shape and contour of the necked-in Silicon pedestal 13N may be adjusted by printing and etching the Silicon fin in a certain orientation on the wafer 10.

In an embodiment of the present invention, the third etchant is a preferential etchant along certain doping concentration gradients in the Silicon fin.

In an embodiment of the present invention, the shape, contour, and dimension of the necked-in Silicon pedestal 13N determine the stiffness and compliance of the Silicon fin.

In an embodiment of the present invention, the stiffness and compliance of the Silicon fin affect the amount of stress applied during the oxidation anneal.

In an embodiment of the present invention, the stiffness and compliance of the Silicon fin affect the amount of strain in the SiGe lattice. In an embodiment of the present invention, the strain affects carrier mobility in a device that may be formed with the Germanium nanowire 16.

In an embodiment of the present invention, the stiffness and compliance of the Silicon fin affect the density of dislocations formed.

In an embodiment of the present invention as shown in block 800 of FIG. 1, an oxidation anneal is performed on the SiGe 15 formed on the upper portion 13U of the Silicon fin 13F.

In an embodiment of the present invention, the oxidation anneal includes an oxidation and an anneal performed at the same time (concurrent).

In an embodiment of the present invention, the oxidation anneal includes an oxidation followed by an anneal (sequential).

In an embodiment of the present invention, the oxidation anneal includes an oxidation and an anneal performed alternatingly (several times) to reach progressively higher Germanium content, and to homogenize Germanium content through a thickness (or depth).

In an embodiment of the present invention, the oxidation anneal includes a dry oxidation and an anneal performed, initially at 1,050 degrees Centigrade to reach 60-65% Germanium content, followed by 900 degrees Centigrade to reach 75-98% Germanium content.

In an embodiment of the present invention, the oxidation and the anneal are performed ex situ in two separate tools or pieces of equipment. In an embodiment of the present invention, the oxidation and the anneal are performed ex situ in two separate chambers or portions of the same tool or piece of equipment. In an embodiment of the present invention, the oxidation and the anneal are performed in situ in the same chamber or portion of the same tool or piece of equipment.

In an embodiment of the present invention, the oxidation is performed in dry (without water) oxygen mixed with a diluent gas or a carrier gas. In an embodiment of the present invention, the diluent gas or carrier gas is a non-oxidizing gas, such as Nitrogen ($N_2$), or forming gas ($H_2/N_2$). In an embodiment of the present invention, the diluent gas or carrier gas is an inert gas, such as Argon (Ar) or Helium (He).

In an embodiment of the present invention, the anneal is performed in a sub-atmosphere or a partial vacuum. In an embodiment of the present invention, the anneal is performed in a non-oxidizing gas, such as Nitrogen (N2), or forming gas ($H_2/N_2$). In an embodiment of the present invention, the anneal is performed in an inert gas, such as Argon (Ar) or Helium (He).

In an embodiment of the present invention, the oxidation anneal is performed at a temperature below a melting point of the SiGe 15.

In an embodiment of the present invention, the oxidation anneal is performed above a temperature (about 950 degrees Centigrade) at which viscous flow of Silicon Oxide will occur.

In an embodiment of the present invention, the oxidation anneal is performed at a temperature of 840-915 degrees Centigrade. In an embodiment of the present invention, the oxidation anneal is performed at a temperature of 915-990 degrees Centigrade. In an embodiment of the present invention, the oxidation anneal is performed at a temperature of 990-1,065 degrees Centigrade.

Silicon and Germanium will interdiffuse in the SiGe depending on a concentration gradient and a thermal gradient. However, Germanium diffuses 5 orders of magnitude faster in Germanium (self-diffusion) than in Silicon. Thus, a diffusion coefficient of Germanium in SiGe increases with increasing Germanium content following an Arrhenius equation $D=D_0 \exp(E_A/kT)$. For relaxed SiGe with a Germanium content of 0.30, $D_0$=4.7 cm$^2$/s and $E_A$=3.82 eV. A diffusion mechanism of Germanium also changes from via interstitialcies and vacancies near pure Silicon to only via vacancies towards pure Germanium.

The Gibbs free energy of formation for $SiO_2$ is lower than that of $GeO_2$. Thus, Silicon is thermally oxidized in a preferential manner over Germanium at a thermal oxidation interface whenever sufficient quantities of Silicon and Germanium are available. Consequently, heating the SiGe 15 shell or cladding on the upper portion 13U of the Silicon fin 13F in a thermal oxidizing ambient results in diffusion of Silicon towards the oxidation interface (outwards for this configuration) and piling up of Germanium away from the oxidation interface (inwards for this configuration).

The Germanium piles up pseudomorphically without forming extended defects. In other words, the Germanium occupies substitutional sites in the Silicon lattice. The ratio of the molecular volumes is 1.13 for Ge/Si compared to 2.25 for $SiO_2$/Si.

Any Germanium that becomes oxidized will tend to be reduced by any nearby Silicon. Thus, the Silicon is incorporated into an Oxide while the Germanium is expelled from the Oxide and pushed in front of an advancing interface for the thermal Silicon Oxide. Overall, net oxidation of the Silicon and net condensation of the Germanium will occur.

Amorphization of the SiGe may occur during Germanium condensation. Amorphization is a breakdown of a crystal lattice structure when too much strain builds up. Amorphization may be an unintentional consequence of performing oxidation at a too low temperature. In an embodiment of the present invention, amorphization cannot be reversed by annealing, As Silicon is thermally oxidized to Silicon Oxide, any dopant that is originally located within the Silicon segregates out of the Silicon and diffuses into the Germanium. In an embodiment of the present invention, the dopant is n-type, such as Arsenic or Phosphorus. In an embodiment of the present invention, the dopant is p-type, such as Boron.

The narrowed-down width 13W of the necked-in Silicon pedestal 13N below the SiGe 15 allows the Silicon to oxidize completely (through its cross-section) to form an underlying Silicon Oxide fin 14F and thus pinches off to prevent the Germanium from diffusing downwards past the Silicon Oxide fin 14F.

In an embodiment of the present invention, the Germanium nanowire 16 includes a Germanium content of 51-59%. In an embodiment of the present invention, the Germanium nanowire 16 includes a Germanium content of 59-67%. In an embodiment of the present invention, the Germanium nanowire 16 includes a Germanium content of 67-75%.

In an embodiment of the present invention, the Germanium nanowire 16 includes a Germanium content of 75-83%. In an embodiment of the present invention, the Germanium nanowire 16 includes a Germanium content of 83-91%. In an embodiment of the present invention, the Germanium nanowire 16 includes a Germanium content of 91-99%.

In an embodiment of the present invention, the Germanium nanowire 16 includes a Germanium content of 100%.

A thermal oxidation rate of the Silicon depends on the crystal orientation at a surface of the Silicon. In an embodiment of the present invention, the thermal oxidation rate is higher on a (110) surface relative to a (001) surface.

In an embodiment of the present invention, the thermal oxidation rate of the Silicon depends on a level of stress in the Silicon.

In an embodiment of the present invention, the surface roughness of the Silicon Oxide changes the level of stress. Surface roughness is measured by Atomic Force Microscopy (AFM).

A unit volume of Silicon become 2.25 unit volumes of thermal Silicon Oxide. The volume expansion during the thermal oxidation of Silicon to form Silicon Oxide creates a compressive strain in the Silicon Oxide.

The SiGe 15 has a large lattice constant which is closer to that of III-V semiconductors than to that of Silicon. Thus, enhancing Germanium content by condensation also adds strain. Strain and content of Germanium in SiGe 15 and Si films are measured by micro-Raman spectroscopy.

In an embodiment of the present invention, the added strain in the SiGe 15 is absorbed by the Silicon Oxide 14 which is partially compliant.

In an embodiment of the present invention, the added strain in the SiGe 15 is relaxed by nucleating misfit dislocations or threading dislocations during the thermal oxidation and the subsequent annealing. In an embodiment of the present invention, the density of the dislocations is high, such as $1.0E7$-$1.0E9$ $cm^{-2}$. In an embodiment of the present invention, the density of the dislocations is moderate, such as $1.0E5$-$1.0E7$ $cm^{-2}$. In an embodiment of the present invention, the density of the dislocations is low, such as $1.0E3$-$1.0E5$ $cm^{-2}$.

In an embodiment of the present invention, the added strain in the SiGe 15 is relaxed by lateral expansion. Lateral expansion is measured with the AFM.

Figure 2J:
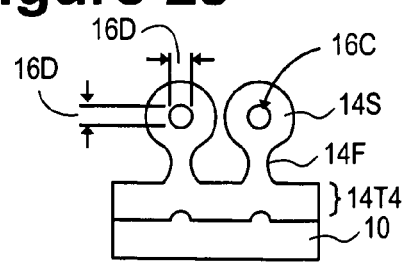

In an embodiment of the present invention as shown in block 900 of FIG. 1 and in FIG. 2J, a Germanium nanowire 16 with a diameter 16D is formed. The Germanium nanowire 16 is attached to a Silicon Oxide fin 14F. The Silicon Oxide fin 14F was formed by thermally oxidizing the underlying Silicon fin 13F.

Figure 3:
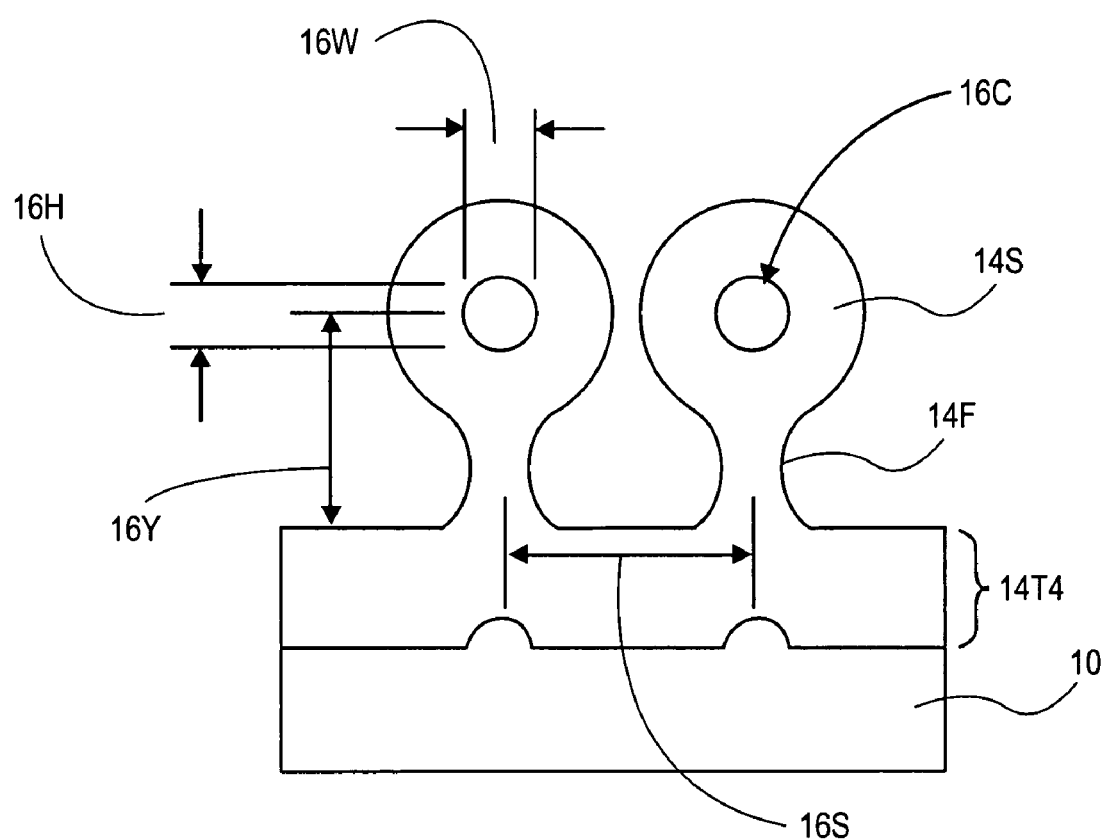
FIG. 3 is an elevation view of a Germanium nanowire that is isolated by Silicon Oxide according to an embodiment of the present invention.

In an embodiment of the present invention as shown in FIG. 3, the Germanium nanowire 16 is located a vertical distance 16Y above a layer of Silicon Oxide located on the wafer 10. In an embodiment of the present invention, the Germanium nanowire 16 is located parallel to an upper surface of the wafer 10.

In an embodiment of the present invention as shown in FIG. 3, the Germanium nanowire 16 has a Germanium core 16C surrounded or wrapped with a Silicon Oxide shell 14S or cladding. The Silicon and Germanium are semiconductor materials while the Silicon Oxide is an electrical insulator. In an embodiment of the present invention, the Germanium nanowire 16 has a Germanium core width 16W and a Germanium core height 16H. In an embodiment of the present invention, the Germanium core width 16W and the Germanium core height 16H have about the same dimension so they can be considered to be equivalent to the Germanium core diameter 16D.

In an embodiment of the present invention, the Germanium nanowire 16 has a cross-section that is approximately cylindrical along its length. In an embodiment of the present invention, the Germanium nanowire 16 includes a long core of Germanium that is surrounded radially by an outer layer or shell of Silicon Oxide 14S. In an embodiment of the present invention, the central Germanium core is covered with a peripheral and circumferential layer of Silicon Oxide 14S.

In an embodiment of the present invention, the Germanium nanowire 16 has a diameter 16D of 2-6 nm. In an embodiment of the present invention, the Germanium nanowire 16 has a diameter 16D of 6-15 nm. In an embodiment of the present invention, the Germanium nanowire 16 has a diameter 16D of 15-30 nm. In an embodiment of the present invention, the Germanium nanowire 16 has a diameter 16D of 30-45 nm.

In an embodiment of the present invention, the Germanium nanowire 16 varies in diameter along its length. In an embodiment of the present invention, the Germanium nanowire 16 includes joints along its length. In an embodiment of the present invention, the joints are irregularly spaced along the Germanium nanowire 16.

In an embodiment of the present invention, the Germanium nanowire 16 has a length of 7-10 um. In an embodiment of the present invention, the Germanium nanowire 16 has a length of 10-15 um. In an embodiment of the present invention, the Germanium nanowire 16 has a length of 15-22 um.

Nanowires have low dimensionality and are considered to be one-dimensional (1D) nanostructures. In an embodiment of the present invention, the Germanium nanowire 16 has a diameter: length aspect ratio of about 1:250-350. In an embodiment of the present invention, the Germanium nanowire 16 has a diameter:length aspect ratio of about 1:350-500. In an embodiment of the present invention, the Germanium nanowire 16 has a diameter:length aspect ratio of about 1:500-700.

In an embodiment of the present invention as shown in FIG. 3, an array of parallel nanowires 16 is formed with a centerline-to-centerline spacing or pitch 16S. In an embodiment of the present invention, the nanowires 16 are supported on a Silicon Oxide fin 14F anchored to a layer of Silicon Oxide with a thickness 14T4. In an embodiment of the present invention, the nanowires 16 include a Germanium core 16C that is formed at a height 16Y above an upper surface of the layer of Silicon Oxide formed on a wafer 10. In an embodiment of the present invention, the Germanium cores 16C of the nanowires 16 include a core width 16W and a core height 16H that may have the same or different dimensions, resulting in a cross-section that may be circular, oval, elliptical, oblong, and so forth. In an embodiment of the present invention, the necked-in pedestal or fin 14F may be made of various materials and may have a certain shape, contour, or dimension with a certain stiffness and compliance.

Many embodiments and numerous details have been set forth above in order to provide a thorough understanding of the present invention. One skilled in the art will appreciate that many of the features in one embodiment are equally applicable to other embodiments. One skilled in the art will also appreciate the ability to make various equivalent substitutions for those specific materials, processes, dimensions, concentrations, etc. described herein. It is to be understood that the detailed description of the present invention should be taken as illustrative and not limiting, wherein the scope of the present invention should be determined by the claims that follow.

We claim:

1. A Germanium nanowire of comprising:
    a Germanium core; and
    a Silicon Oxide shell disposed around said Gemanium core;
    wherein the Germanium nanowire comprises a diameter of 30-45 nm.

2. A Germanium nanowire of comprising:
    a Germanium core; and
    a Silicon Oxide shell disposed around said Gemanium core;
    wherein the Germanium nanowire comprises a length of 7-10 um.

3. A Germanium nanowire of comprising:
a Germanium core; and
a Silicon Oxide shell disposed around said Gemanium core;
wherein the Germanium nanowire comprises a Germanium content of 91-99%.

* * * * *